: US 8,248,122 B2
(45) Date of Patent: Aug. 21, 2012

(12) United States Patent
Shibagaki et al.

(54) DIGITAL PLL CIRCUIT AND METHOD OF CONTROLLING THE SAME

(75) Inventors: Taro Shibagaki, Tokyo (JP); Satoru Nunokawa, Hino (JP); Masaki Kato, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/882,711

(22) Filed: Sep. 15, 2010

(65) Prior Publication Data

US 2011/0109353 A1    May 12, 2011

(30) Foreign Application Priority Data

Nov. 9, 2009  (JP) .................................. 2009-256531
Sep. 7, 2010  (JP) .................................. 2010-200304

(51) Int. Cl.
*H03L 7/06*  (2006.01)
(52) U.S. Cl. ........ 327/156; 327/147; 327/157; 327/158; 327/159; 327/161
(58) Field of Classification Search .................. 327/156, 327/157, 159
See application file for complete search history.

(56) References Cited

U.S. PATENT DOCUMENTS 7,355,462 B1 * 4/2008 Wong et al. ................... 327/156

FOREIGN PATENT DOCUMENTS

| JP | 1-173919 | 7/1989 |
| JP | 4-311160 | 11/1992 |
| JP | 8-18446 | 1/1996 |
| JP | 2000-323982 | 11/2000 |
| JP | 2001-60864 | 3/2001 |
| JP | 2005-277459 | 10/2005 |

OTHER PUBLICATIONS

Notice of Reasons for Rejection for Application No. 2010-200304, from the Japanese Patent Office, mailed Sep. 27, 2011.

* cited by examiner

*Primary Examiner* — John Poos
(74) *Attorney, Agent, or Firm* — Finnegan, Henderson, Farabow, Garrett & Dunner, L.L.P.

(57) ABSTRACT

According to one embodiment, a PLL circuit generates a first signal of 1/m times from a reference clock and a second signal of 1/n times from an output of an oscillator, obtains a quantized phase difference corresponding to a shift amount between the both signals, integrates the phase difference, predicts a control value for the oscillator based on the integrated value, converts the predicted control value into an analog value. Sequential integration is performed for the phase difference until the polarity of the phase difference is reversed from negative to positive and then from positive to negative again, or until the polarity is reversed from positive to negative and then from negative to positive again, a predictive weight value is generated by multiplying the integrated value by a predictive coefficient value of optional ratio, and the control value is obtained by adding the predictive weight value to the integrated value.

4 Claims, 6 Drawing Sheets

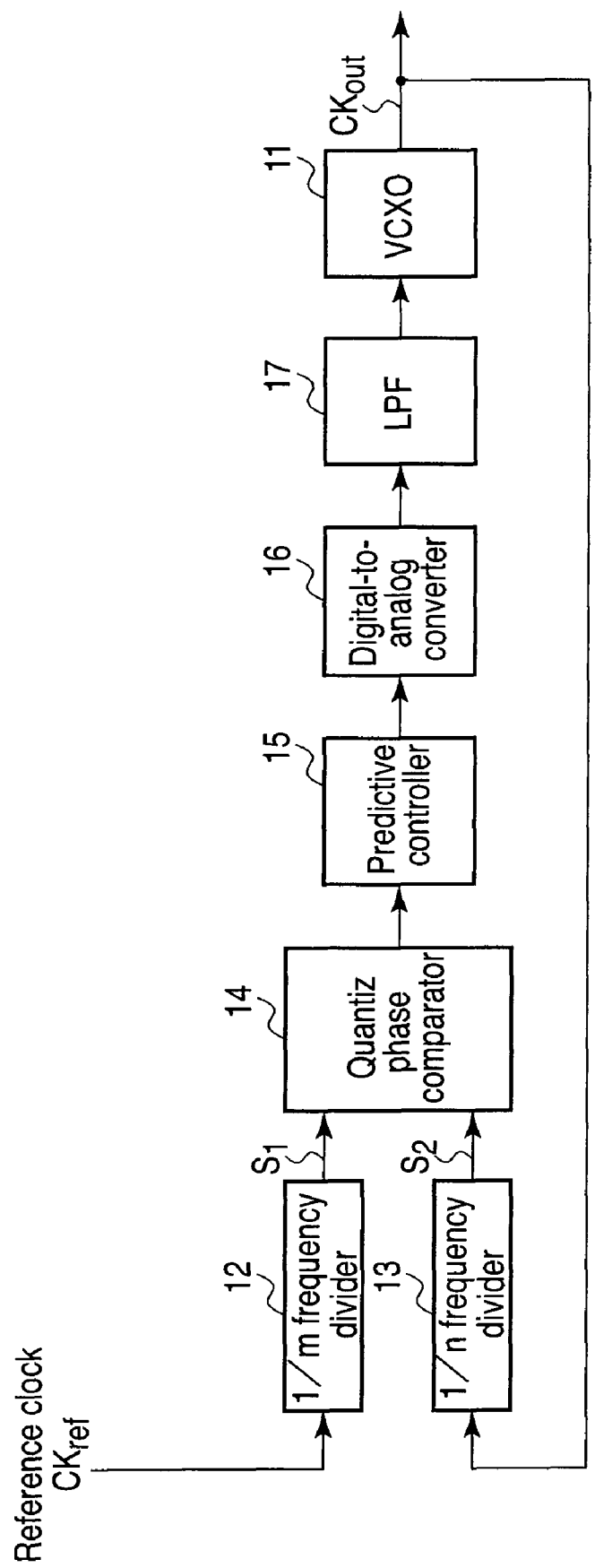
F I G. 1

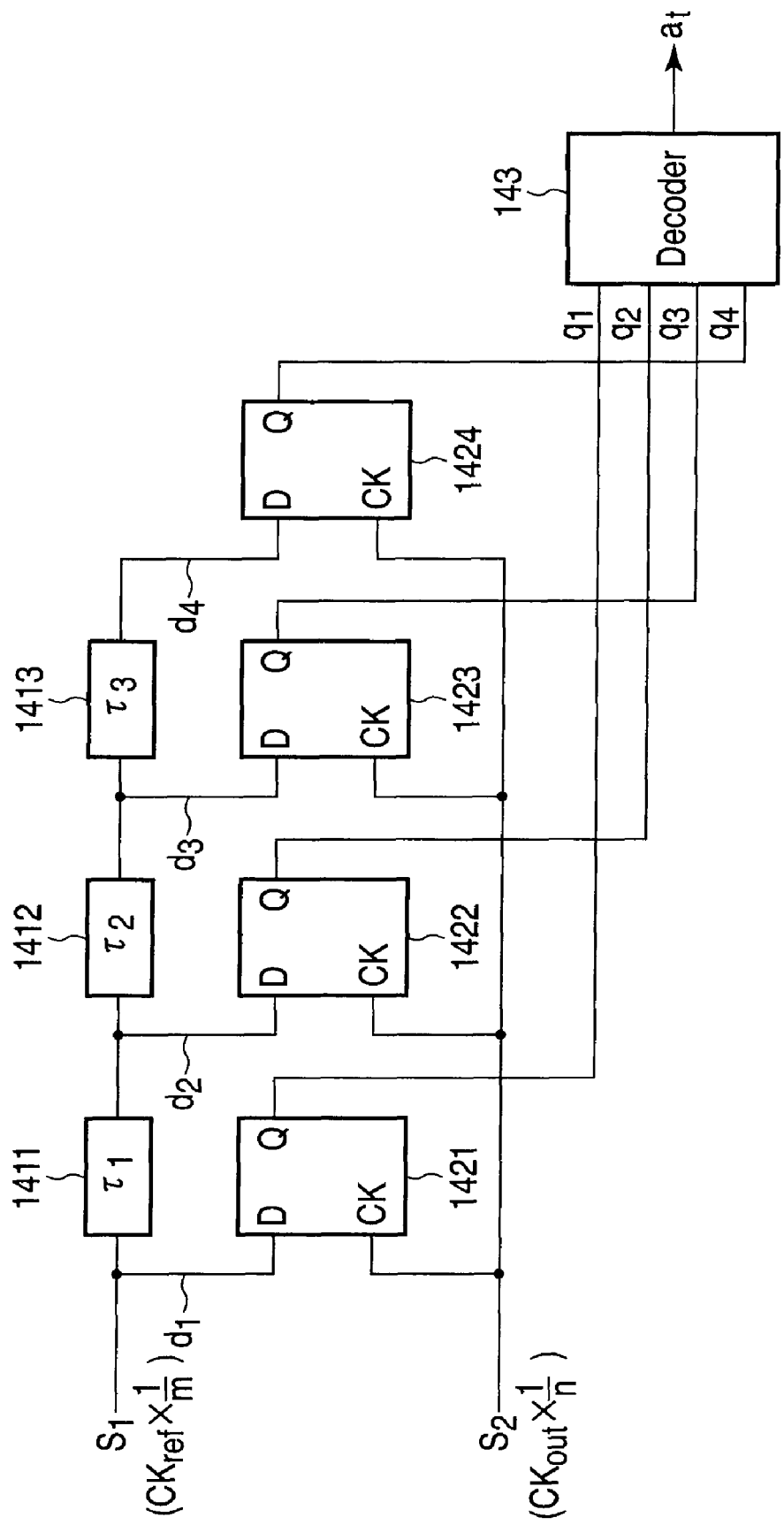
F I G. 2

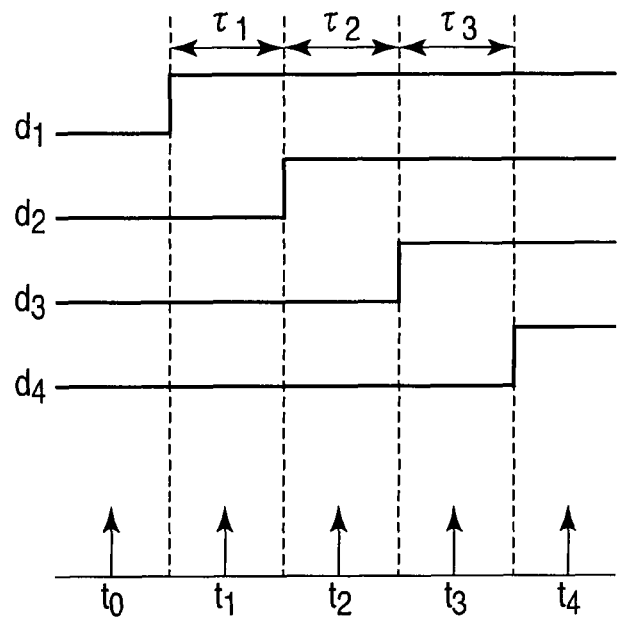
FIG. 3
FIG. 4
|  | $q_1$ | $q_2$ | $q_3$ | $q_4$ |  |  |
|---|---|---|---|---|---|---|
| $t_0$ | 0 | 0 | 0 | 0 | → | 0 |
| $t_1$ | 1 | 0 | 0 | 0 | → | 1 |
| $t_2$ | 1 | 1 | 0 | 0 | → | 2 |
| $t_3$ | 1 | 1 | 1 | 0 | → | 3 |
| $t_4$ | 1 | 1 | 1 | 1 | → | 4 |
FIG. 5
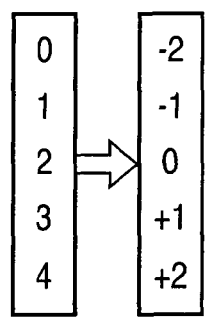

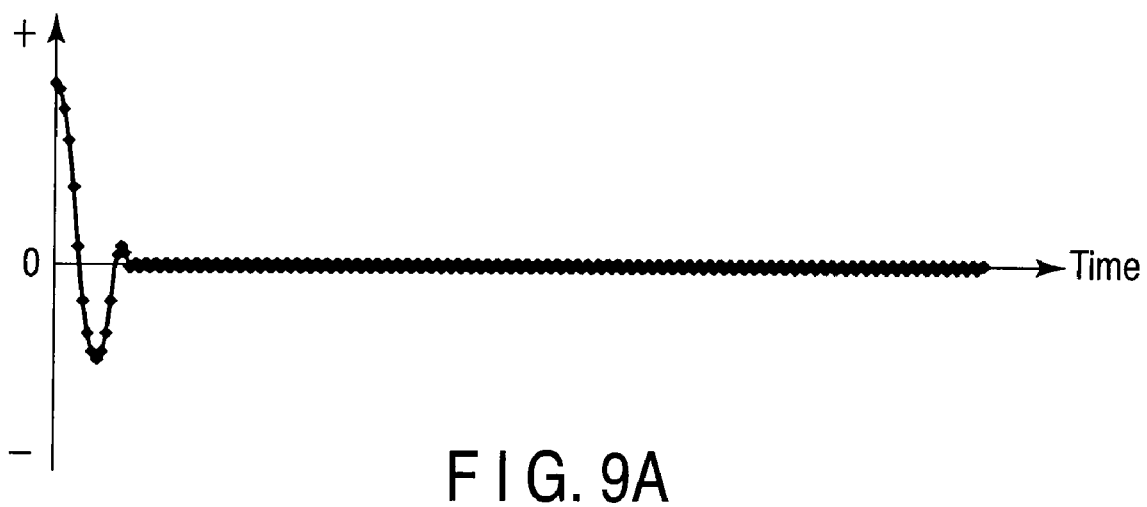
F I G. 9A
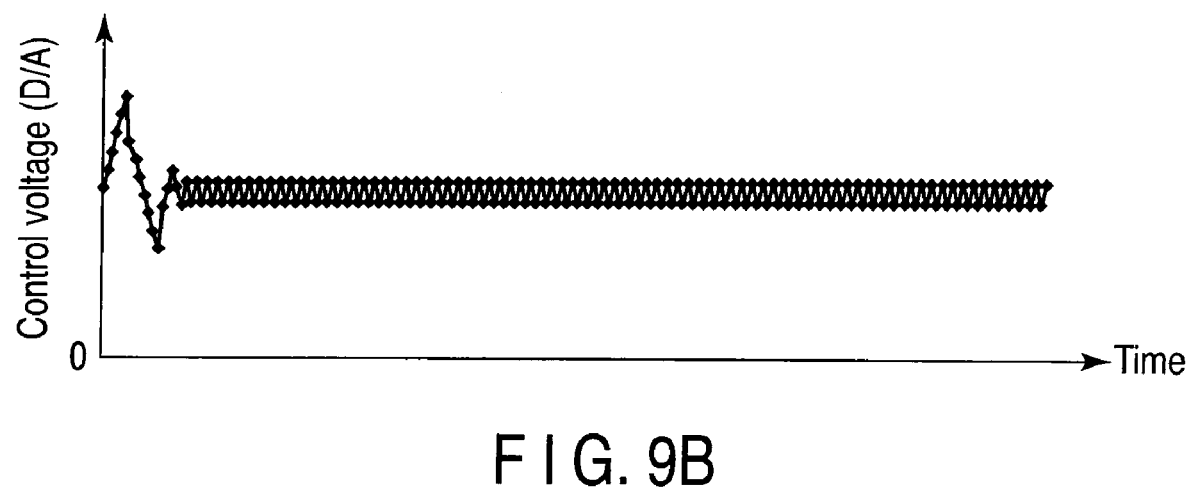
F I G. 9B

DIGITAL PLL CIRCUIT AND METHOD OF CONTROLLING THE SAME

CROSS-REFERENCE TO RELATED APPLICATIONS

This application is based upon and claims the benefit of priority from Japanese Patent Applications No. 2009-256531, filed Nov. 9, 2009; and No. 2010-200304, filed Sep. 7, 2010; the entire contents of both of which are incorporated herein by reference.

FIELD

Embodiments descried herein relate generally to a digital phase-locked loop (PLL) circuit, which generates a clock signal of n/m times frequency from a reference clock signal by digital control.

BACKGROUND

In a digital PLL circuit which generates a clock signal of n/m times frequency from a reference clock signal, an infinite impulse response (IIR) or finite impulse response (FIR) digital filter is often used as a loop time constant. The digital filter is designed to determine a control voltage of a voltage control crystal oscillator (VCXO) from a phase error obtained by a phase comparator. Such a high-order filter requires a high-performance analog-to-digital converter and a digital signal processor (DSP) for arithmetic operations, increasing the size of a whole PLL circuit.

On the other hand, it is necessary to set a low cutoff frequency of a low-pass filter (to set a long control time constant) to realize ultra-high-stable phase synchronization in a digital PLL circuit. However, if a low cutoff frequency is set (a long control time constant is set), pull-in time becomes long, and a long-period fluctuation is caused by disturbance.

To solve the above problem, a cutoff frequency is made variable at the time of pulling-in and steady operation. Further, as disclosed in Jpn. Pat. Appln. KOKAI Publication No. 2001-060864, an integrator circuit is used in a loop, and oscillation occurred in the steady operation caused by a time constant of the integrator circuit is prevented. However, in such a configuration, an analog-to-digital converter and DSP for arithmetic operations are required to realize a high-performance digital filter, and a circuit size is inevitably increased.

As described above, in a conventional digital PLL circuit, a control time constant must be set long to realize ultra-high-stable phase synchronization, and a long-period fluctuation is caused by disturbance. Besides, a digital filter increases a circuit size.

BRIEF DESCRIPTION OF THE DRAWINGS

FIG. 1 is a block diagram showing a configuration of a digital PLL circuit according to an embodiment;

FIG. 2 is a block diagram showing a specific configuration of a quantized phase comparator of the embodiment;

FIG. 3 is a timing chart illustrating the input-and-output relationships of each of D-type flip-flops of the quantized phase comparator;

FIG. 4 is a diagram illustrating a shift amount of an input signal to the quantized phase comparator and an output value of each of the flip-flops;

FIG. 5 is a quantized phase difference corresponding to the shift amount of the input signal;

FIGS. 9A and 9B are waveforms showing phase differences and control voltage changes in the digital PLL circuit of FIG. 1, for explaining operation when a predictive controller is used.

DETAILED DESCRIPTION

Figure 6:
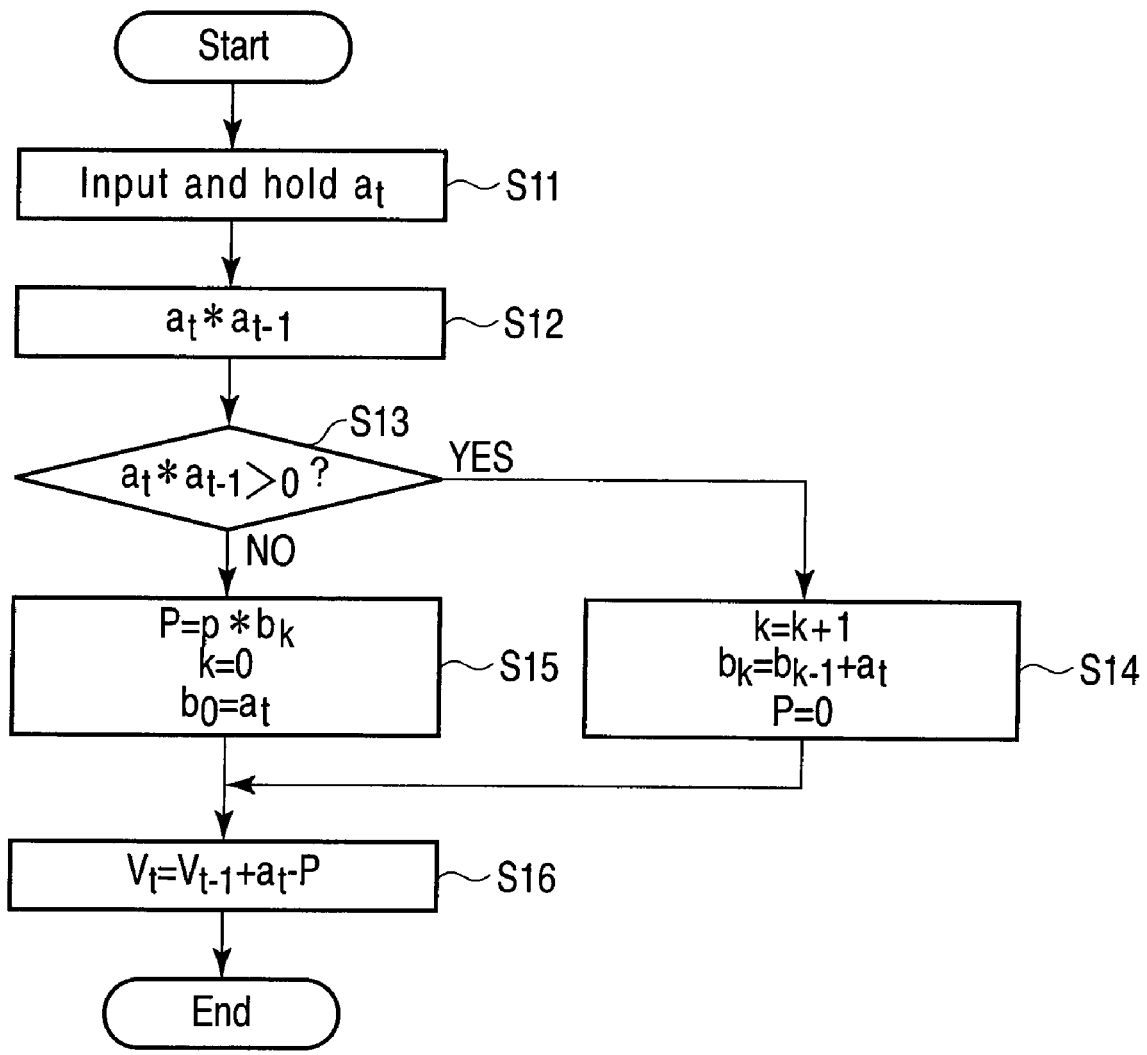
FIG. 6 is a flowchart illustrating a process flow of a predictive controller of the embodiment.

In general, according to one embodiment, a digital PLL circuit includes: an oscillator which varies an oscillating frequency by an analog value; a first frequency divider which generates a first frequency signal of 1/m times (m: an optional number) from a reference clock signal; a second frequency divider which generates a second frequency signal of 1/n times (n: an optional number) from an output signal of the oscillator; a quantized phase comparator which compares phases of the first and second frequency signals, and obtains a quantized phase difference corresponding to a shift amount between the first and second frequency signals; a predictive controller which integrates the quantized phase difference for a predetermined period, and predicts a control value for the oscillator based on the integrated value; and a converter which converts the control value into an analog value for the oscillator, wherein the predictive controller performs sequential integration of the quantized phase difference until a polarity of the quantized phase difference is reversed from negative to positive and then from positive to negative again or until the polarity is reversed from positive to negative and then from negative to positive again, generates a predictive weight value by multiplying the integrated value by a predictive coefficient value of optional ratio, and obtains a control value for the oscillator by adding the predictive weight value to the integrated value.

In this manner, the gain that tends to vary in accordance with the temperature change can be stabilized.

As configured above, according to the embodiment, there is provided a digital PLL circuit, which realizes ultra-high-stable phase synchronization with a short control time constant in a relatively simple circuit configuration, and a method of controlling the digital PLL circuit.

Hereinafter, an embodiment will be explained in detail with reference to the accompanying drawings.

FIG. 1 is a block diagram showing a configuration of a digital PLL circuit according to an embodiment. The digital PLL circuit shown in FIG. 1 has a velocity changing function, which synchronizes a clock of 1/n times of a PLL output clock $CK_{out}$ generated by an internal voltage controlled crystal oscillator (VCXO) 11, with a clock of 1/m times of an external reference clock $CK_{ref}$.

Specifically, the external reference clock $CK_{ref}$ is divided into 1/m by a 1/m frequency divider. The oscillation clock $CK_{out}$ generated by the VCXO 11 is divided into 1/n by a 1/n frequency divider 13, and sent to a quantized phase comparator 14 together with the reference clock $CK_{ref}$ divided into 1/m by the 1/m frequency divider 12. The quantized phase comparator 14 outputs a quantized shift amount δ between a signal $S_1$ obtained by dividing the reference clock $CK_{ref}$ into 1/m and a signal $S_2$ obtained by dividing the output clock $CK_{out}$ into 1/n. For example, the comparator may comprise a field programmable gate array (FPGA), and delay lines.

FIG. 2 is a block diagram showing the configuration of the quantized phase comparator 14. In FIG. 2, the signal $S_1$ obtained by obtained by dividing the reference clock $CK_{ref}$ into 1/m is sequentially delayed by delay lines 1411, 1412, and 1413 having delay amount of $\tau_1$, $\tau_2$ and $\tau_3$. A signal $d_1$ obtained by branching the signal $S_1$, and signals $d_2$ to $d_4$ obtained by sequentially delaying the signal $S_1$ by the delay amount of $\tau_1$, $\tau_2$ and $\tau_3$ of the delay lines 1411 to 1413 are supplied to the D-terminals of D-type flip-flops 1421 to 1424.

On the other hand, the signal $S_2$ obtained by dividing the output clock $CK_{out}$ into 1/n is supplied to the CK-terminals of the D-type flip-flops 1421 to 1424. The D-type flip-flops 1421 to 1424 latch the level value of the input to the D-terminal at the rising timing of the clock input to the CK-terminal, and outputs the latched level value from the Q-terminal. The Q-terminal outputs q1, q2, q3 and q4 of the D-type flip-flops 1421 to 1424 are applied to a decoder 143.

The decoder 143 calculates a quantized value corresponding to the shift amount between the signals $S_1$ and $S_2$, from the level values of the Q-terminal outputs q1 to q4.

FIG. 3 is a timing diagram showing the relationship between the timing waveforms of the D-terminal input signals d1 to d4 of the D-type flip-flops 1421 to 1424 and the level values of the Q-terminal output signals q1 to q4 at the rising timing $t_1$, $t_2$, $t_3$, $t_4$ and $t_5$ of the signal $S_2$. It is seen from FIG. 3 that when the signal $S_2$ rises at the timing t1 to t5, the level values shown in FIG. 4 are obtained from the Q-terminal outputs q1 to q4 of the D-type flip-flops 1421 to 1424.

The decoder 143 takes in the level values of the Q-terminal outputs q1 to q4 of the D-type flip-flops 1422 to 1424, and converts them into quantized values (quantized phase difference) corresponding to the shift amount between the signals $S_1$ and $S_2$. For example, as shown in FIG. 5, when q1, q2, q3 and q4 are as follows at the time t, the quantized phase difference $a_t$ is output as follows.

0, 0, 0, 0: −2
1, 0, 0, 0: −1
1, 1, 0, 0: 0
1, 1, 1, 0: +1
1, 1, 1, 1: +2

The quantized phase difference $a_1$ obtained by the quantized phase comparator 14 is sent to a predictive controller 15.

The predictive controller 15 has a simple structure capable of performing arithmetic operations by addition. It is composed of a field programmable gate array (FPGA), for example. It performs sequential integration of a quantized phase difference $a_t$ between input signals S1 and S2 until the polarity of the phase difference is reversed from negative to positive and then from positive to negative again or until the polarity is reversed from positive to negative and then from negative to positive again, calculates a predictive weight value (correction value) by multiplying a predictive coefficient p (specifically, a value between −0.5 to −0.05) to the integrated value, and adds the predictive weight value to the integrated value obtained until then.

FIG. 6 is a flowchart showing the operation of the predictive controller 15. First, when the quantized phase difference at the time t $a_t$ is supplied from the quantized phase comparator 14, the predictive controller holds the quantized phase difference at the time t $a_t$ (step S11). Then, the predictive controller reads out the quantized phase difference $a_{t-1}$ held at the last time t−1, and multiplies it by the quantized phase difference $a_1$ at the input time t (step S12). Then, the predictive controller determines whether the polarity of the result of the multiplication $a_t*a_{t-1}$ is correct (step S13). When the polarity is positive, the predictive controller assumes that the number of calculations k is k+1, and adds the quantized phase difference $a_t$ at the time t to the result of the addition up to the last time $b_{k-1}$, and sets the result of the addition $b_k$ of this time ($=b_{k-1}+a_t$) and the correction value P to zero (step S14). When the polarity is not positive, 0 or negative, the predictive controller obtains a correction value P ($=p*b_k$) by multiplying the result of the addition of this time $b_k$ by the predictive coefficient p, and sets k=0 and $b_0=a_1$ (step S15).

After steps S14 and S15, the predictive controller obtains the control voltage Vt at the time t by the following equation (step S16).

$$V_t = V_{t-1} + a_t - P$$

The control voltage value predicted by the predictive controller 15 is converted into an analog voltage by a digital-to-analog converter 16, filtered by a loop time constant determined by a low-pass filter (LPF) 17, and supplied to the VCXO 11 as a frequency control voltage.

In the above configuration, algorithm of the predictive controller 15 will be explained with reference to FIGS. 7A and 7B, FIGS. 8A and 8B, FIGS. 9A and 9B.

Figure 7A:
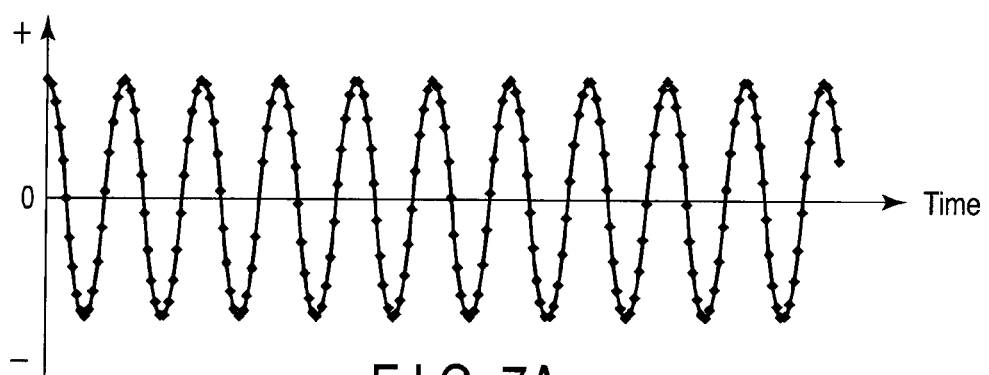
FIGS. 7A and 7B are waveforms showing a phase difference and control voltage change in the digital PLL circuit of FIG. 1, for explaining operation when a predictive controller is not used.
Figure 7B:
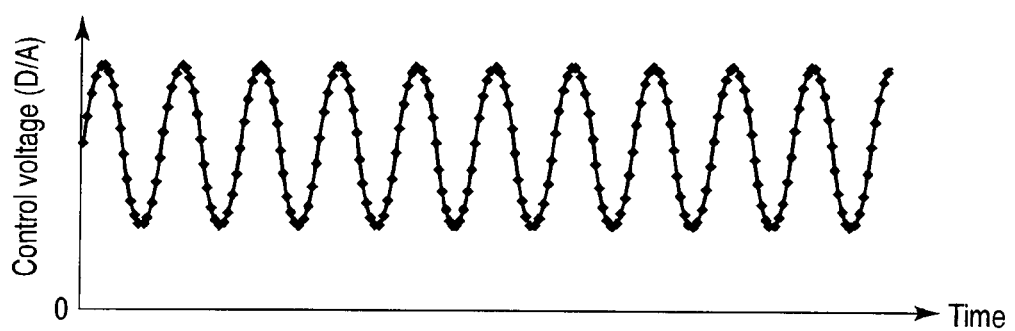

In the above configuration of embodiment, it is assumed first that a phase difference obtained by the quantized phase comparator 14 is converted into a voltage value without using the predictive controller, and the voltage value is supplied to the VCXO 11 as a frequency control voltage through the LPF 17. When a frequency fluctuates because of disturbance, the control voltage $V_{cont}$ (the output to the digital-to-analog converter 16) does not converge, the output phase continuously oscillates as shown in FIG. 7A, and the control voltage $V_{cont}$ also continuously oscillates, suppressing the oscillation as shown in FIG. 7B.

Figure 8A:
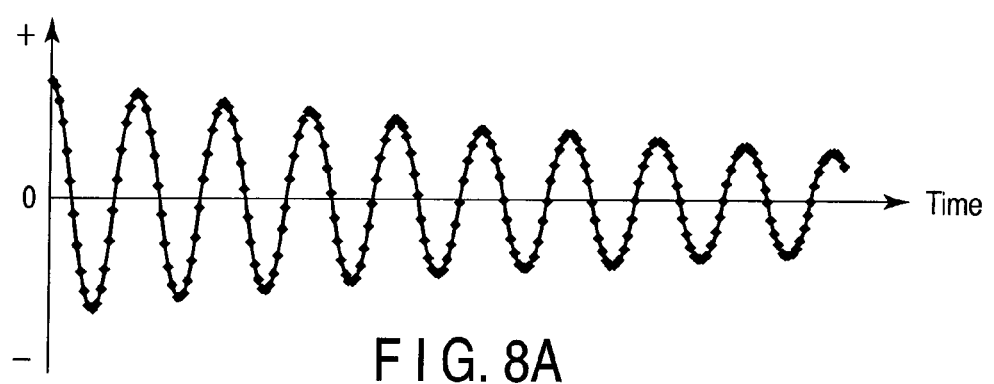
FIGS. 8A and 8B are waveforms showing phase differences and control voltage changes in the digital PLL circuit of FIG. 1, for explaining operation when a predictive controller is not used, and a loop time constant is given by using a primary IIR filter.
Figure 8B:
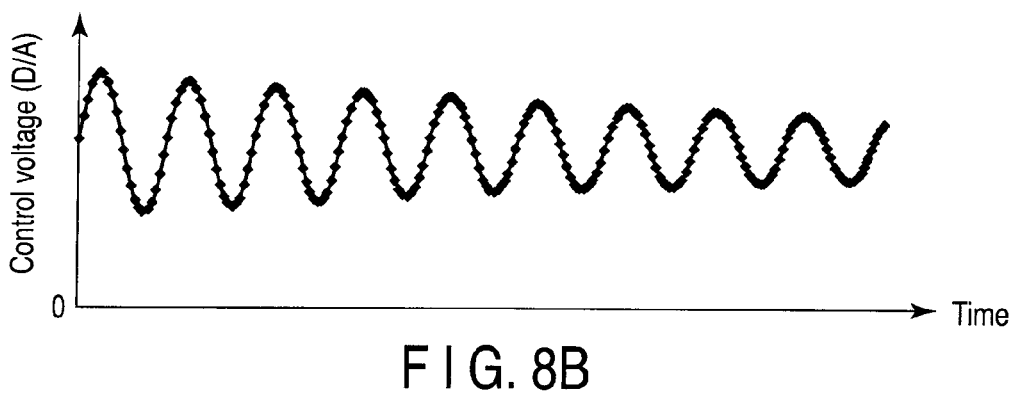

To converge the above oscillation, an IIR (Infinite Impulse Response) digital filter is usually used to give a loop time constant. Then, the output phase converges as shown in FIG. 8A, and the amplitude of the control voltage $V_{cont}$ also converges as shown in FIG. 8B. However, the time required for the convergence is determined by a time constant of the digital filter, and it takes certain time to stabilize the output phase.

Next, an explanation will be given of generation of a frequency control signal based on a phase difference obtained by the quantized phase comparator 14 by using the predictive controller 15.

The predictive controller 15 obtains the quantized phase difference δ of the signal $S_1$ that is 1/m times of the reference clock $CK_{ref}$ and signal $S_2$ that is 1/n times of the output clock $CK_{out}$, which are obtained by the quantized phase comparator 14.

When the polarity is reversed as shown in FIG. 9A, the control voltage $V_{cont}$ is corrected so that its polarity is reversed. As a result, the amplitude of the control voltage $V_{cont}$ rapidly converges as shown in FIG. 9B, and the phase difference immediately converges and stabilizes. In FIG. 9B, the control voltage $V_{cont}$ seems to fluctuate after converging. This is caused by binarization, and causes no negative effects.

As described hereinbefore, in the digital PLL circuit according to the above embodiment, integration is sequentially performed for a quantized phase difference δ until the polarity of the phase difference is reversed from negative to positive and then from positive to negative again or until the polarity is reversed from positive to negative and then from negative to positive again. A predictive weight value is calculated by multiplying a predictive coefficient of −0.5 to −0.05) to the integrated value. The predictive weight value is added to the integrated value obtained until then. The result of this addition is used as control voltage $V_{out}$. In this manner, the control voltage converges to an optimum value in accordance with changes in the quantized phase difference, and ultra-high-stable phase synchronization can be realized with a relatively simple circuit configuration without using a high-precision digital filter.

While certain embodiments have been described, these embodiments have been presented by way of example only, and are not intended to limit the scope of the invention. Indeed, the novel methods and systems described herein may be embodiment in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A digital PLL circuit comprising:
   an oscillator which varies an oscillating frequency by an analog value;
   a first frequency divider which generates a first frequency signal of 1/m times (m: an optional number) from a reference clock signal;
   a second frequency divider which generates a second frequency signal of 1/n times (n: an optional number) from an output signal of the oscillator;
   a quantized phase comparator which compares phases of the first and second frequency signals, and obtains a quantized phase difference corresponding to a shift amount between the first and second frequency signals;
   a predictive controller which integrates the quantized phase difference for a predetermined period, and predicts a control value for the oscillator based on the integrated value; and
   a converter which converts the control value into an analog value for the oscillator,
   wherein the predictive controller performs sequential integration of the quantized phase difference until a polarity of the quantized phase difference is reversed from negative to positive and then from positive to negative again or until the polarity is reversed from positive to negative and then from negative to positive again,
   generates a predictive weight value by multiplying the integrated value by a predictive coefficient value of optional ratio, and
   obtains a control value for the oscillator by adding the predictive weight value to the integrated value.

2. The digital PLL circuit according to claim 1, wherein the predictive coefficient value is −0.5 to −0.05 times.

3. A method of controlling a digital PLL circuit, comprising:
   for an oscillator which varies an oscillating frequency by an analog value,
   generating a first frequency signal of 1/m times (m: an optional number) from a reference clock signal;
   generating a second frequency signal of 1/n times (n: an optional number) from an output signal of the oscillator;
   obtaining a quantized phase difference corresponding to a shift amount between the first and second frequency signals by comparing phases of the first and second frequency signals,
   integrating the quantized phase difference for a predetermined period;
   predicting a control value for the oscillator based on the integrated value;
   converting the predicted control value into an analog value, and using the analog value;
   performing sequential integration of the quantized phase difference until a polarity of the quantized phase difference is reversed from negative to positive and then from positive to negative again or until the polarity is reversed from positive to negative and then from negative to positive again;
   generating a predictive weight value by multiplying the integrated value by a predictive coefficient value of optional ratio, and
   obtaining a control value for the oscillator by adding the predictive weight value to the integrated value.

4. The method of controlling a digital PLL circuit according to claim 3, wherein the predictive coefficient value is −0.5 to −0.05 times.

* * * * *